United States Patent [19]

Shidlovsky et al.

[11] 4,451,783

[45] May 29, 1984

[54] METHOD OF DETECTING SYMMETRICAL COMPONENTS OF SUPPLY-LINE THREE-PHASE VOLTAGE AND DEVICE FOR CARRYING OUT SAME

[75] Inventors: Anatoly K. Shidlovsky; Sergei G. Taranov; Voldmir V. Braiko, all of Kiev; Isaak P. Grinberg, Zhitomir; Jury F. Tesik; Oleg L. Karasinsky, both of Kiev, all of U.S.S.R.

[73] Assignee: Institut Elektrodinamiki Akademii Nauk Ukrainskoi SSR, Kiev, U.S.S.R.

[21] Appl. No.: 299,088

[22] Filed: Sep. 3, 1981

[51] Int. Cl.[3] ............................................. G01R 25/00
[52] U.S. Cl. ........................................ 324/86; 324/107
[58] Field of Search ................ 307/127; 324/107, 108, 324/86; 328/133, 155

[56] References Cited

U.S. PATENT DOCUMENTS

| | | | |
|---|---|---|---|
| 3,617,863 | 11/1971 | Espen | 324/86 |
| 3,705,344 | 12/1972 | Espen | 324/86 |
| 4,023,075 | 5/1977 | Reuter | 324/86 |

Primary Examiner—Michael J. Tokar
Attorney, Agent, or Firm—Burgess, Ryan & Wayne

[57] ABSTRACT

A method of detecting symmetrical components of a three-phase supply-line voltage comprises the steps of converting three-phase voltage to alternating single-phase voltage with the aid of at least two function generators (2), (3), with at least one of said function generators being an active-reactive circuit, which conversion of a three-phase voltage is effected by altering said supply-line voltage in amplitude and phase in said active-reactive circuits, and subsequently summing up output voltages of the function generators (2), (3), to produce symmetrical components of said three-phase voltage, forming a control signal proportional to a disturbance influencing the output voltages of the active-reactive circuits (4) and compensating said disturbance influence by control action, wherein according to the invention said control signal is formed from the difference in voltage drop between elements (5), (6) in each active-reactive circuit, and compensating said disturbance influence is done by summing up said control signal and said voltage drop across one of said elements (5), (6) in each active-reactive circuit (4).

16 Claims, 18 Drawing Figures

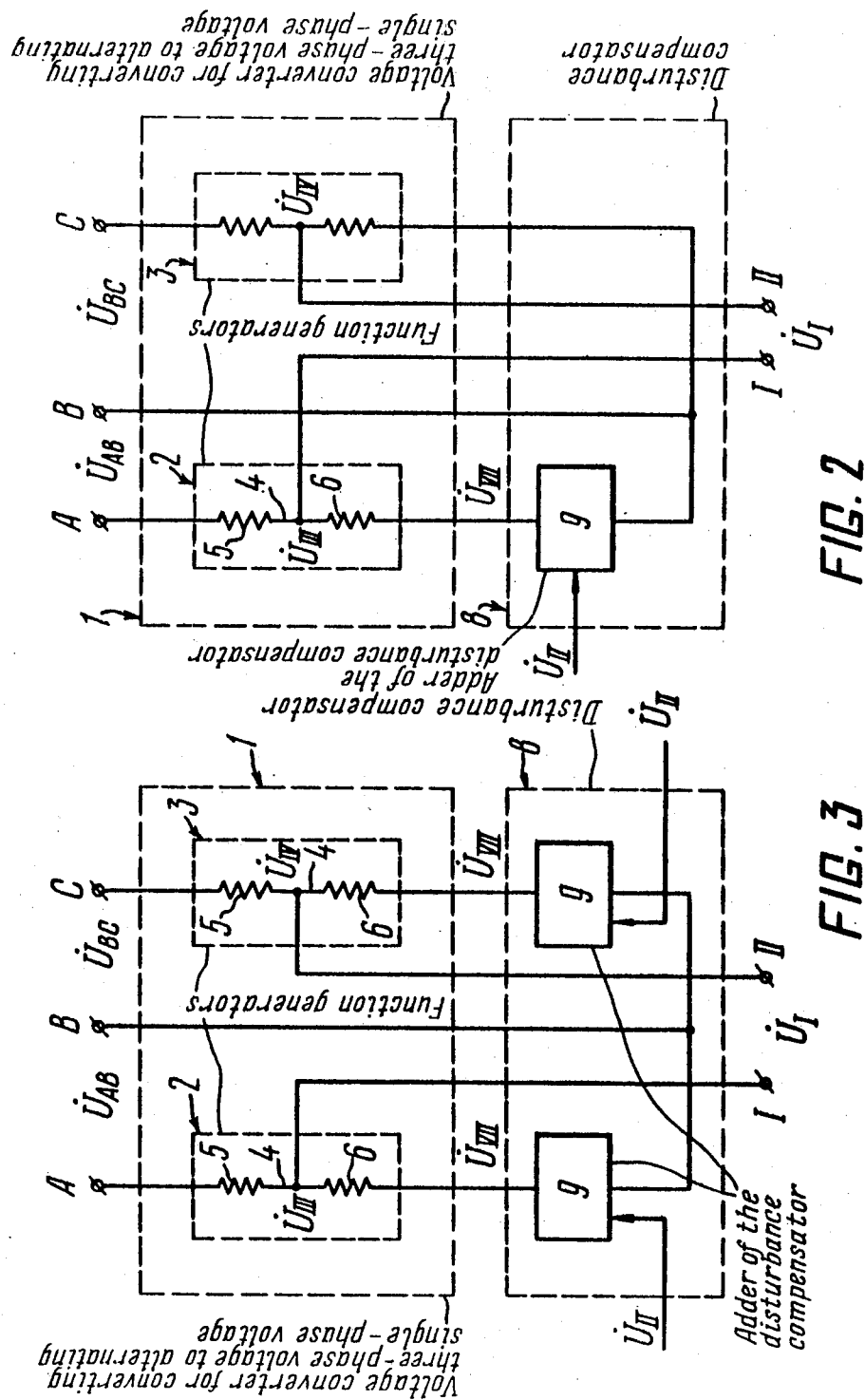

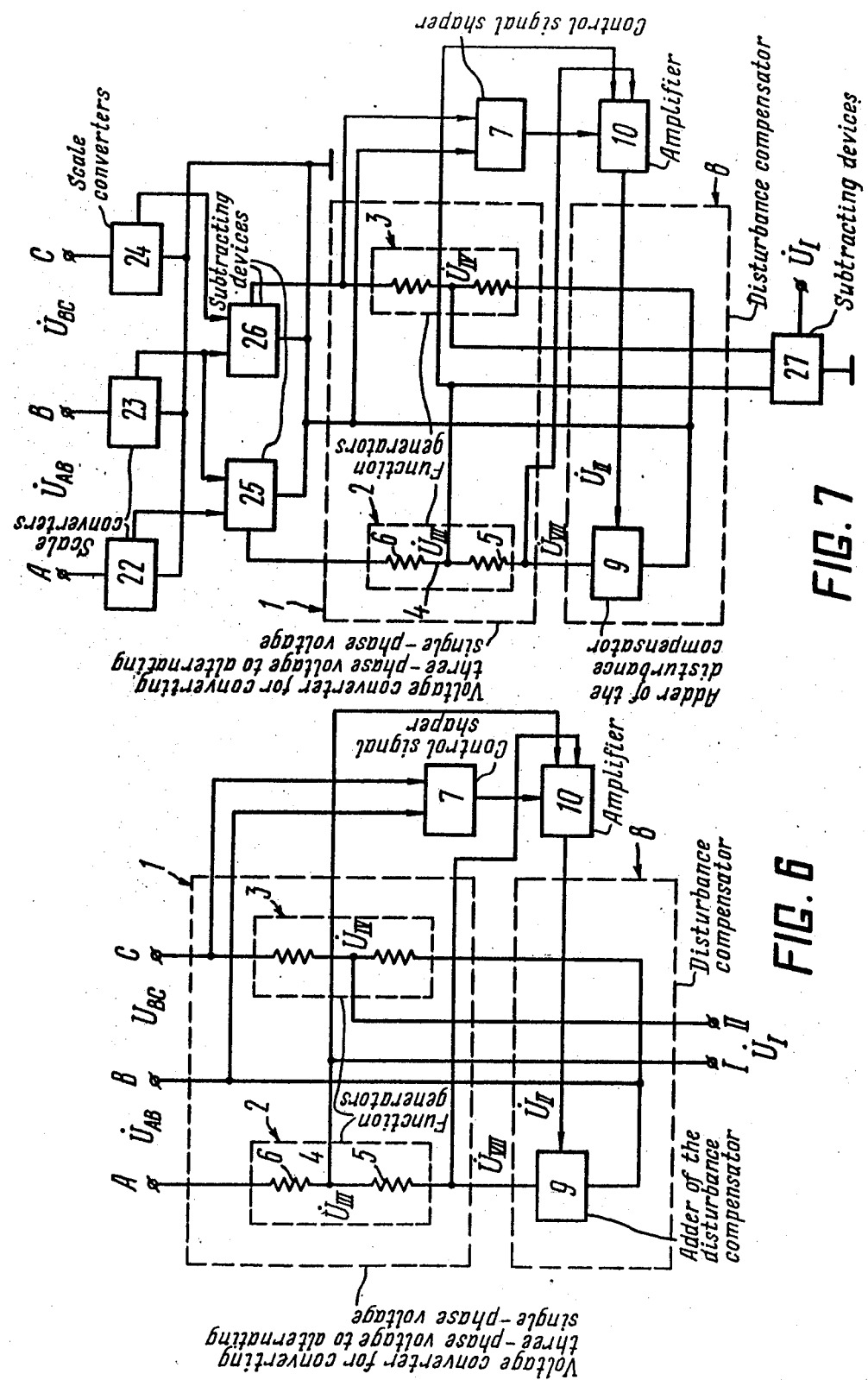

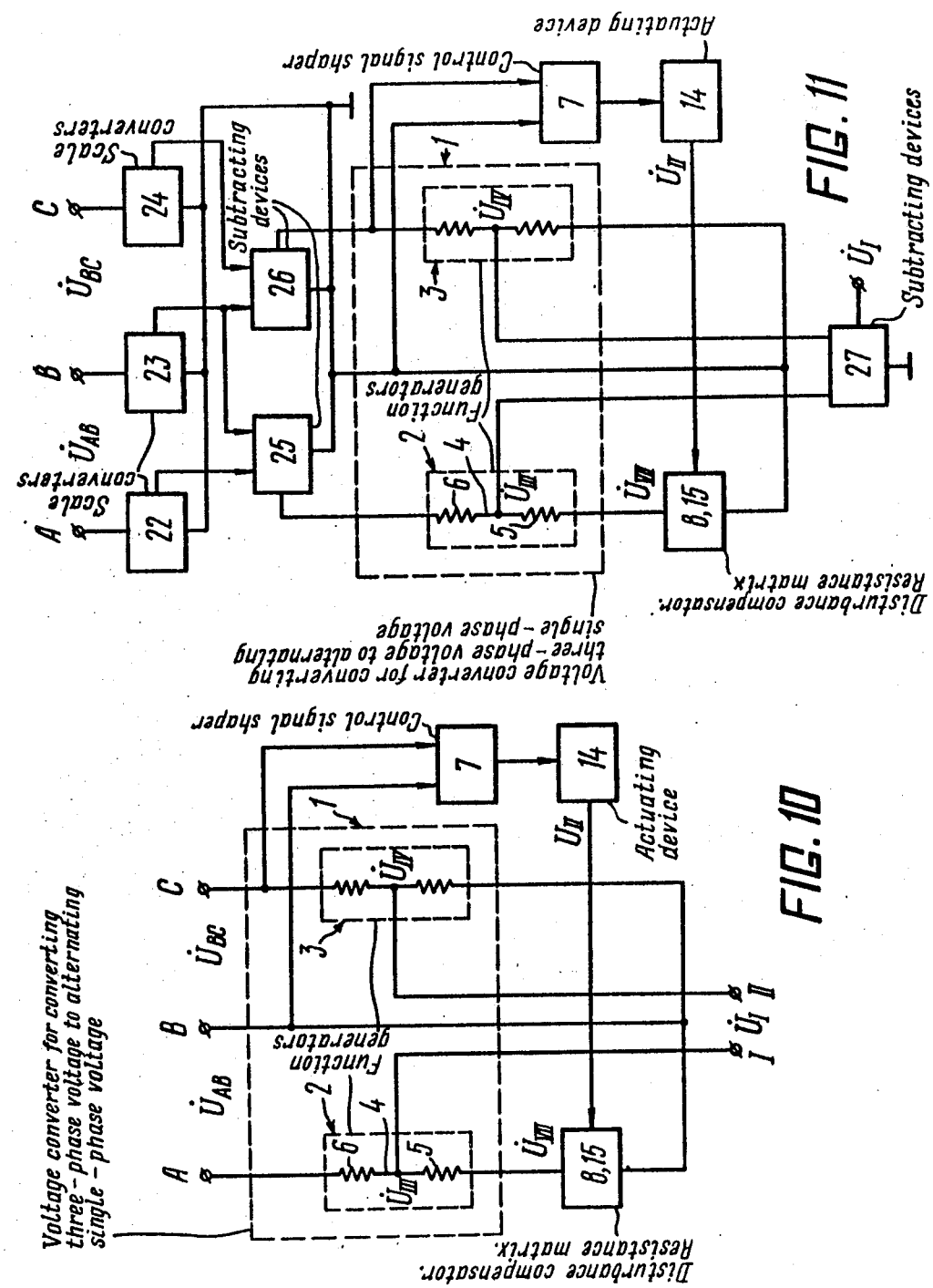

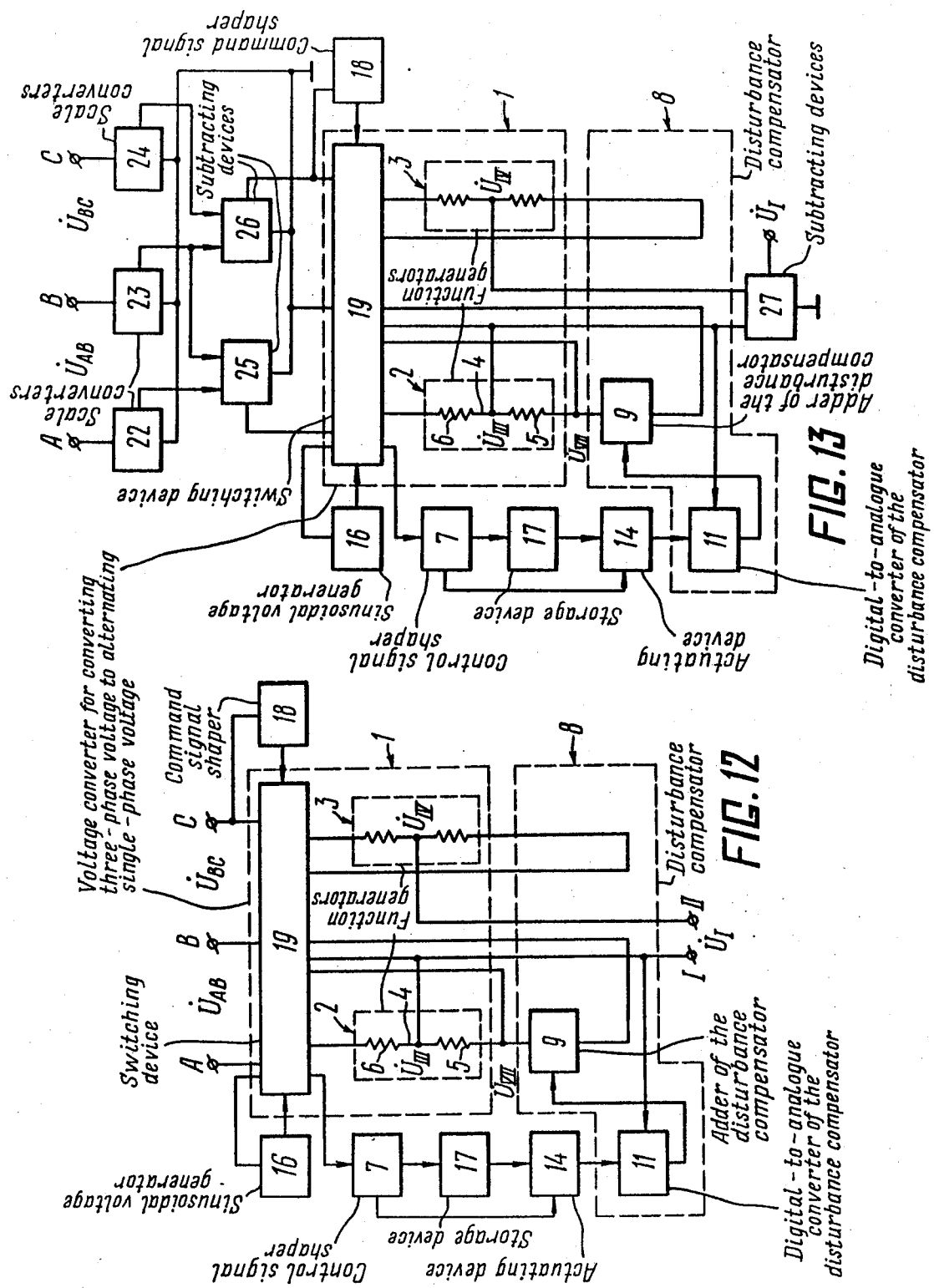

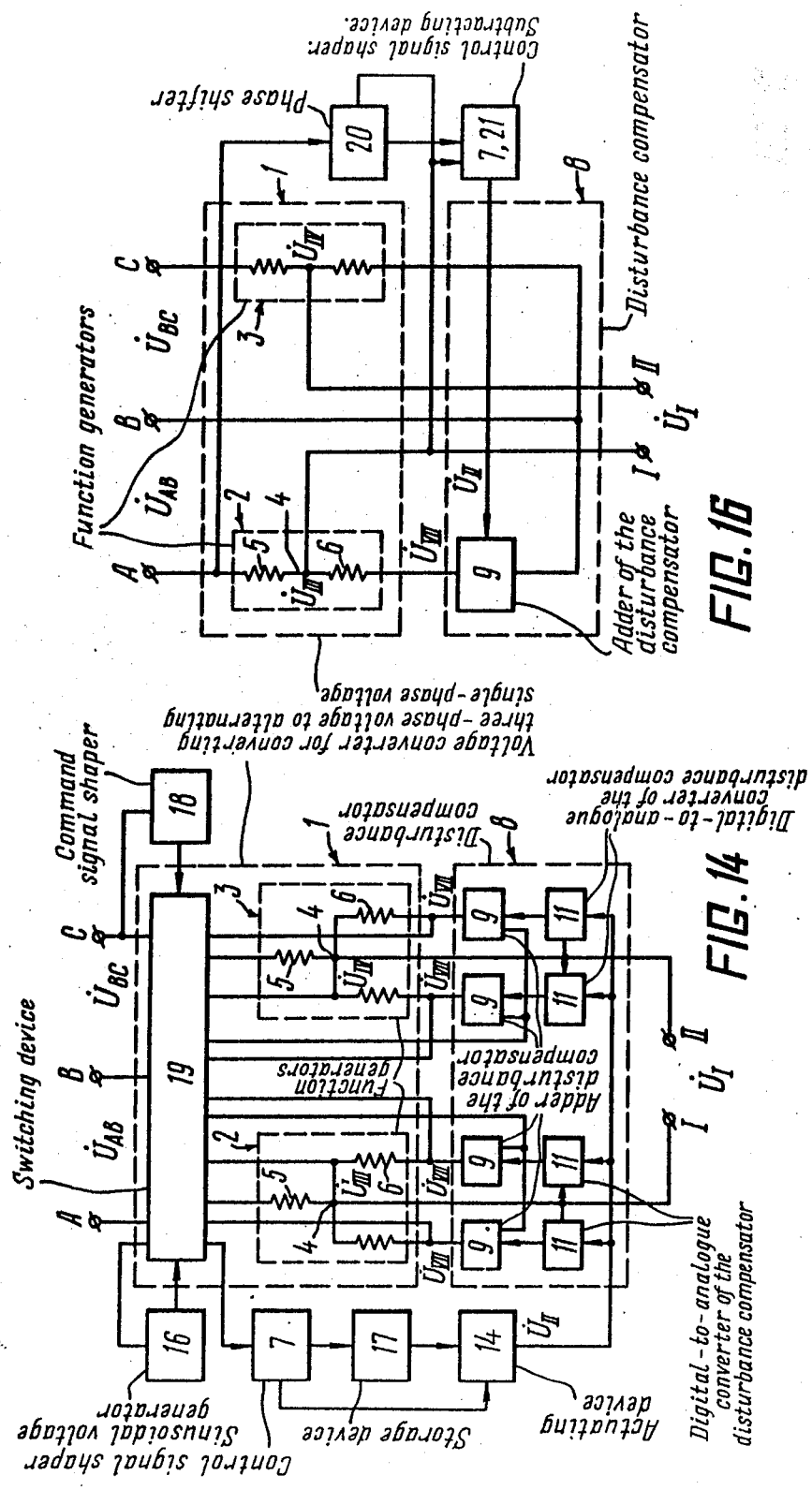

METHOD OF DETECTING SYMMETRICAL COMPONENTS OF SUPPLY-LINE THREE-PHASE VOLTAGE AND DEVICE FOR CARRYING OUT SAME

BACKGROUND OF THE INVENTION

1. Field of the Invention

The present invention relates to a method and device for detecting symmetrical components of the positive phase sequence (PPS), negative phase-sequence (NPS), and zero phase-sequence (ZPS) of a three-phase voltage in a consumer supply line.

The invention may be used in measuring electric power quality factors (asymmetry in a three-phase voltage, voltage fluctuation, and neutral point shift) for shaping control signals to operate relay protection and automatic systems in three-phase supply lines, and for shaping signals to operate devices controlling the electric power quality.

2. Prior Art

Methods which are now used for discriminating symmetrical components of the PPS, NPS and ZPS of a three-phase supply-line voltage and devices for carrying out these methods have large errors in discriminating symmetrical components, which errors are caused by supply-line frequency fluctuations as well as by time and temperature variations of the reactive element parameters in active-reactive circuits and by the interference of higher harmonics in the devices used to carry out said methods.

FRG Application No. 2,702,011 laying open /Int. Cl. G01R 29/16, June 20, 1978/ discloses a method for detecting asymmetry in multi-phase systems, wherein discriminating symmetrical components of a supply-line three-phase voltage is based on converting a supply-line three-phase voltage to a single-phase voltage proportional to the asymmetry of the three-phase voltage. Such conversion is effected through summing up a voltage vector of one of the phases of a three-phase voltage and a vector produced by summing up said first vector shifted by a phase-shifting (active-reactive) circuit for an angle of $\pi/2$ and a vector which is equal to the difference of the voltage vectors of two other phases of a three-phase voltage, which difference being decreased $\sqrt{3}$ times, shifting in phase the resulting combined vector for an angle of $\pi/2$ by a phase-shifting circuit (active-reactive circuit), shifting in phase this vector for an angle of $\pi$ by an inverter, and adding the resulting vector to said first phase voltage vector.

This method, however, has a large error in detecting asymmetry, which error is caused because the signal being measured is influenced by frequency, temperature, and time variations in the parameters of reactive elements in the phase-shifting circuits.

There is also known a method of detecting symmetrical components of a multi-phase supply-line voltage, carried out with the aid of a device disclosed in FRG Patent No. 2,220,990 /Int. Cl. G01R 29/16, Jan. 20, 1977/. This method comprises the formation from line voltages of a common point for four voltages shifted in pairs relative each other for an angle $\pi$, and converting the resulting combined voltages with the aid of active-reactive circuits to a single-phase voltage proportional to the PPS-voltage or NPS-voltage of the three-phase line symmetrical components.

The formation of the four voltages relative one point, shifted in pairs for an angle of $\pi$ allows summing up output voltages of the active-reactive circuits relative one point for detecting symmetrical components. This voltages are influenced to a lesser degree by frequency, temperature and time variations in the parameters of reactive elements, which results in a more accurate detection of symmetrical components.

However, errors which may be introduced in measured values in the case of using this method are also coonsiderable typically being on the order of 10%, in addition, the need for transformers forming a 4-voltage system of the type required, beside being a bulky and heavy arrangement, is one which cannot readily be manufactured by mass production methods.

There is also known a method for detecting symmetrical components of a three-phase supply-line voltage and a device for measuring said symmetrical components, used for carrying out the same /cf. USSR Author's Certificate No. 517,860, Int. Cl. G01R 29/16, June 20, 1976/, wherein the frequency errors are compensated.

This method comprises converting three-phase voltage to single-phase voltage being equal to a sum of voltages proportional to the voltages of positive and negative sequences, with said conversion being effected with the use of at least two function generators, at least one of said generators being an active-reactive circuit; converting said alternating single-phase voltage to direct voltage; forming a control voltage proportional to a disturbance influence; and subsequently compensating said disturbance influence by said control voltage. Conversion of a three-phase voltage to a single-phase one is done by varying the supply-line voltage in phase and amplitude with the use of at least one active-reactive circuit, and subsequently summing up the output voltages of the function generators. Forming said control voltage is accomplished by detecting in the compensation channel a voltage proportional to a line frequency departure, and compensating an error caused by said frequency departure by subtracting the control voltage from the single-phase direct voltage equal to a sum of voltages proportional to voltages of the positive and negative sequences of a three-phase voltage.

A device for carrying out this method has a measuring channel including input scale converters and connected in series a voltage converter adapted to convert three-phase voltage to single-phase alternating voltage, a selective amplifier, a voltage converter for converting alternating single-phase voltage to direct voltage, an adder, and a compensating channel including connected in series a second selective amplifier and a frequency detector for shaping a control voltage. The voltage converter, for converting three-phase voltage to single-phase one, includes active-reactive (that is phase-shifting) circuits and an adder. The input of the selective amplifier in the compensating channel is connected to a three-phase supply-line, and the output of the frequency detector is connected to one of the inputs of the adder in the measuring channel. The disadvantage of the above method and apparatus is that the frequency error voltage component at the output of the active-reactive circuits has a non-linear frequency dependence, while said voltage is compensated by a voltage having a linear frequency dependence and being produced in the compensation channel. In addition, said method and the apparatus to carry out this method do not rule out an error which may be caused by temperature or time factors. Errors may also be caused by inaccurate conversion of an alternating single-phase voltage to a direct voltage, instability of a gain factor of the selective amplifier, and inaccurate formation of the control voltage by the selective amplifier and frequency detector in the compensation channel.

Furthermore, the above apparatus has an equipment duplication: there are two selective means and a voltage converter for converting alternating voltage to a direct one. The device includes transformers which are not easy-adaptable to manufacture and have a large weight and size.

SUMMARY OF THE INVENTION

This invention relates to a method and device for deriving the symmetrical components of a three-phase power line voltage. The technique involves the generation of symmetrical component signals, combining of said signals to produce a composite three-phase signal, comparing the composite signal with the power line voltage to be analyzed, and using the result of the comparison to alter the individual symmetrical component signals until the combination thereof corresponds to the power line voltage being analyzed.

BRIEF DESCRIPTION OF THE DRAWINGS

The invention will now be explained with reference to embodiments thereof which are represented in the accompanying drawings, wherein:

FIG. 2 is a block diagram illustrating a way in which a method of the invention can be realized with the use of one active-reactive circuit;

FIG. 3 is a block diagram illustrating a way in which a method of the invention can be realized with the use of two active-reactive circuits;

FIG. 6 is a functional diagram of a device for carrying out one modification of a method of the invention;

FIG. 7 shows the same as in FIG. 6, including additional scale converters and subtracting devices;

FIG. 10 is a functional diagram of still another device to carry out this modification of a method of the invention;

FIG. 11 is the same as in FIG. 10, including additional scale converters and substracting devices;

FIG. 12 is a functional diagram of yet another device to carry out this modification of a method of the invention;

FIG. 13 is the same as in FIG. 12, including additional scale converters and subtracting devices;

FIG. 14 is a functional diagram of still another device to carry out this modification of a method of the invention;

FIG. 16 is a functional diagram of a device to realize another modification of a method of the invention;

SYSTEM DESCRIPTION

Figure 5:
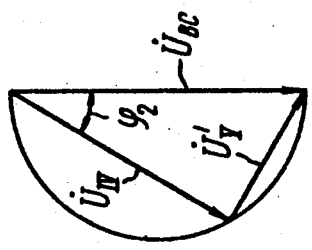
FIGS. 4, 5 show vector diagrams of voltage drops across elements of the active-reactive circuits.
Figure 18:
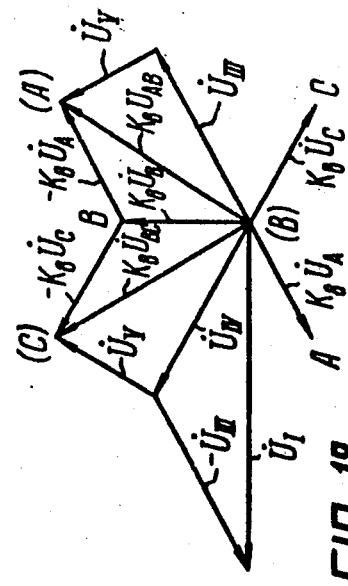
FIG. 18 illustrates a vector diagram showing operation of the proposed devices incorporating additional scale converters and subtracting devices.

The principal object of the invention is to provide a method and a device for detecting symmetrical components of positive and negative sequences of a three-phase supply-line voltage, which due to elimination of errors caused by frequency, time and temperature factors and of errors caused by upper harmonics, ensure a high accuracy in detecting symmetrical components of said three-phase supply-line voltage.

Another object of the invention is to simplify the operation of a device for carrying out this method.

These and other objects of the invention are accomplished by that in a method for detecting symmetrical components of a three-phase supply-line voltage which comprises converting said three-phase voltage to alternating single-phase voltage with the aid of at least two function generators, at least one of said function generators being an active-reactive circuit, said voltage conversion being accomplished by altering said voltages in phase and amplitude with the use of said active-reactive circuits and subsequently summing up the output voltages of the function generators so as to produce symmetrical components of a three-phase voltage; forming a control signal proportional to a disturbance influencing the output voltages of the active-reactive circuits; and compensating said disturbance influence by the control signal, according to the invention the control signal is formed from the difference in voltage drop between elements of each active-reactive circuit, and compensating the disturbance influence is done by combining the control signal with the voltage drop across one of the elements in each active-reactive circuit.

Compensation of the disturbance influence according to this method is effected directly in the active-reactive circuits with the aid of a control signal which is formed by utilizing the difference in voltage drop between the elements of these circuits, which allows the errors, which may be caused by frequency, time and temperature variations in the elements of these circuits and by interference of the upper harmonics, to be ruled out.

In a modification of the method for detecting symmetrical components of three-phase line voltage the formation of the control signal on the basis of disbalance of the voltage drops across the elements in each active-reactive circuit is done proportionally to the frequency departure.

In this case the control signal is altered according to the linear law proportionally to a voltage drop variation across the reactive elements of the active-reactive circuits, which allows a frequency error in detecting symmetrical components to be entirely eliminated.

Such construction of the device provides for a high accuracy in detecting symmetrical components of a three-phase supply-line voltage which is achieved due to the fact that frequency errors are completely eliminated by compensating them relative an alternating current in the active-reactive circuits, as well as a better reliability, and more favorable weight and size.

In another modification of the proposed method of detecting symmetrical components of a three-phase supply-line voltage a control signal is formed from the difference between the voltage drops across the active and reactive elements in each active-reactive circuit proportionally to the period departure.

Such modification of the proposed method ensures a high accuracy in detecting symmetrical components, as in this case it is possible to use active-reactive circuits wherein as reactive elements use may be made of inductance coils and capacitors, and also due to the possibility to form the control signal proportionally to the period departure, which is effected, as a rule, with the use of digital devices featuring a high accuracy and speed of response. It should be also noted that this modification of the proposed device entirely rules out not only frequency errors but other errors as well (such as those caused by time and temperature factors and those caused by the interference of upper harmonics).

In a device to carry out this modification of the proposed method, comprising a voltage converter electrically connected to the phases of a supply line and adapted to convert three-phase voltage to alternating single-phase voltage, and which voltage converter includes at least two function generators, at least one of which function generators is an active-reactive circuit, a control signal shaper adapted to produce a control signal proportional to a disturbance influence, and a disturbance compensator, according to the invention the control signal shaper is an analog-digital converter adapted to convert a period to a control signal, and the disturbance compensator is made in the form of at least one digital-to-analogue converter, at least one gyrator which also serves as a reactive element of the corresponding active-reactive circuit, and at least one capacitor connected to the output of the corresponding gyrator, the inputs of said digital converter are connected to the phases of a supply line and the outputs thereof connected to the first input of the corresponding digital-to-analogue converter having its second input connected to the output of the active-reactive circuit, and the output is connected to the control input of the corresponding gyrator connected in series with the corresponding active element of the active-reactive circuit, and the outputs of the function generators are electrically connected to the information outputs of the device.

The information of the control signal which is proportional to the period departure made it possible to use as an inductance element gyrators and connected therewith capacitors which endow the device for realizing this modification of the proposed method with a higher accuracy thermal stability, and smaller size and weight.

Another device to realize this modification of the proposed method, comprising a voltage converter electrically connected to the phases of a supply line and adapted to convert a three-phase voltage to an alternating single phase voltage, which voltage converter including at least two function generators, at least one of which generators being made in the form of an active-reactive circuit, a control signal shaper adapted to produce control signals proportional to a disturbance influence, and a disturbance influence compensator, according to the invention further includes an actuating device, and the control signal shaper is analog-to-digital converter adapted to convert a period to a control signal, the disturbance influence compensator is made in the form of at least one resistance matrix and has one lead connected to an active element of the corresponding active-reactive circuit, the input of the to-digital-analogue converter for converting a period of a control signal is connected to the phase of a supply line and the output thereof is connected to the input of the actuating device having its output connected to the second lead of said compensator, whose third lead is the input of the three-phase voltage converter, said converter having input terminals connected to the 3 phases of said supply line, and the outputs of the function generators are connected to the information outputs of the device.

Such construction of the device also provides for a high accuracy in detecting symmetrical components. Furthermore, due to the use of a resistance matrix as a compensator the device allows a capacitor having a high Q-factor, small size and weight as compared with an inductance element, to be used as a reactive element in the active-reactive circuit. It also makes it possible to simplify summing up of control voltage and a voltage drop across the elements of the active-reactive circuits and to further reduce a size and weight of the device as a whole.

Yet another device to carry out the above modification of the proposed method, comprising a voltage converter electrically connected to the phases of a supply line and being adapted to convert a three-phase voltage to an alternating single-phase voltage, which voltage converter including at least two function generators at least one of which function generators is made in the form of an active-reactive circuit, a control signal shaper to form control signals proportional to a disturbance influence, and a disturbance influence compensator made in the form of at least one adder, according to the invention further includes a sinusoidal voltage generator, a storage device, an actuating device and a common signal shaper, and wherein the voltage converter for converting three-phase voltage to alternating single-phase voltage is additionally provided with a switching device, the disturbance influence compensator is additionally provided with at least one digital-to-analogue converter, and the control signal shaper is made in the form of an to-digital-analogue converter adapted to convert periods to control signals, each digital-to-analogue converter of the compensator is connected in series with the first lead of the corresponding adder of the compensator, the second lead of each adder is connected to the active element of the corresponding active-reactive circuit, the leads of the switching device of the voltage converter for converting a three-phase voltage to an alternating single-phase voltage are connected to the output of the command signal shaper having its input connected to a supply-line phase, the terminals of the generator, the output of each active-reactive circuit, each being connected to the first input of the corresponding digital-to-analogue converter, connection points of each active element and of the corresponding adder of the disturbance influence compensator, the third input of each adder of the compensator, the reactive element of each active-reactive circuit, the control signal shaper having its first output connected to the input of the storage device having its output connected to the first input of the actuating device having its second input connected to the second output of the control signal shaper and its output connected to the second input of each digital-to-analogue converter, and the outputs of the function generators are electrically connected to the information outputs of the device.

The oscillation period of the sinusoidal voltage generator is determined by the reactive elements of the active-reactive circuits, whose parameters vary in time and with the ambient temperature variations. This enables formation of the control signal on the basis of the generator oscillation periods, thereby providing for that while detecting said symmetrical components the temperature and time errors be completely ruled out.

Still another device for carrying out the above modification of the proposed method, comprising a voltage converter electrically connected to the phases of a supply line and adapted to convert a three-phase voltage to an alternating single phase voltage, said voltage converter including two function generators constructed in the form of active-reactive circuits, a control signal shaper adapted to form control pulses proportional to a disturbance influence, and a disturbance influence compensator made in the form of an adder, according to the invention it further includes a command signal generator, a sinusoidal voltage generator, a storage device, and an actuating device, the disturbance influence compensator is further provided with four digital-to-analogue converter and three adder, the voltage converter for converting three-phase voltage to alternating single-phase voltage includes a switching device, two active-reactive circuits, each being further provided with an reactive element, and wherein the control signal shaper is an digital-to-analogue converter adapted to convert periods to control signals, the first leads of the reactive elements in each active-reactive circuit are connected to one another and to the output of its active-reactive circuit, the output of each digital-to-analogue converter in the disturbance influence compensator is connected to the first input of the corresponding adder, the first inputs of each two digital-to-analogue converters are connected to the output of the corresponding active-reactive circuit, and the second leads of the adders connected to these digital-to-analogue converters are connected to the second leads of the reactive elements of the same active-reactive circuit, the leads of the switching device in the voltage converter for converting three-phase voltage to alternating single-phase voltage are connected to the output of the command signal generator having its input connected to a supply-line phase, generator terminals, the active elements of the active-reactive circuits, the third lead of each adder in the disturbance influence compensator, the outputs of each active-reactive circuit, the input of the control signal shaper, connection points of second lead of each reactive element in each active-reactive circuit, and of the second lead of the corresponding adder, the first output of the control signal shaper is connected to the input of the storage device having its output connected to the first input of the actuating device having its second input connected to the second output of the control signal shaper, its output connected to the second input of each digital-to-analogue converter, and the output of the function generators are electrically connected with the information outputs of the device.

Such construction of the proposed device rules out frequency, time and temperature errors, whereas the presence of additional digital-to-analogue converters, adders and reactive elements makes it possible to reduce an error caused by the interference of the upper harmonics without increasing a size of the device.

It is expedient that in a method for detecting symmetrical components of a three-phase supply-line voltage the formation of a control signal from the disbalance of voltage drops across the active and reactive elements in each active-reactive circuit be effected by shifting a voltage drop vector of one of the elements of the active-reactive circuit, subsequently altering said vector in amplitude according to the relation between the voltage drops across the active and the reactive element of this active-reactive circuit, and subtracting from the voltage drop vector of the other element of the same circuit.

Forming a control signal in this manner permits simultaneously compensating temperature, frequency and time errors with the use of only one compensation channel, which enables the construction of the device to be simplified.

A device to carry out this modification of the proposed method comprising a voltage converter electrically connected to the phases of supply-line and adapted to convert a three-phase voltage to an alternating single-phase voltage, said voltage converter having at least two function generators, at least one of which function generators being an active-reactive circuit, a control signal shaper adapted to form control signals proportional to a disturbance influence, and a disturbance influence compensator which is at least one adder, according to the invention is also provided with at least one phase shifter, the control signal shaper includes at least another one subtracting device, each phase shifter has an input connected to one of the elements of the corresponding active-reactive circuit, and an output connected to the first input of the corresponding subtracting device having its second input connected to the other element of the same active-reactive circuit, the output of each subtracting device is connected to the first lead of the corresponding adder of the disturbance influence compensator having its second lead connected to one of the inputs of the active-reactive circuit, and the outputs of the function generators are electrically connected to the information outputs of the device.

It is further expedient that all the above-mentioned devices used to realize the above said modifications of the proposed method additionally include three scale converters and three additional subtracting devices, with the outputs of two scale converters being connected with the first inputs of two additional subtracting devices, and the output of the third scale converter being connected to other two inputs of these two additional subtracting devices having their outputs connected to the inputs of the voltage converter for converting a three-phase voltage to an alternating single-phase voltage, the outputs of the function generators connected to the inputs of the third subtracting device, the first inputs of all the three scale converters are connected to the phases of a supply-line, and their second inputs, and the second inputs of these function generators and the second outputs of the subtracting devices are earthed.

The presence of these three scale converters and three subtracting elements allows the formation of the output signal relative the ground ruling out the influence of inducing on the elements of the active-reactive circuits and thereby improving a noise immunity in detecting symmetrical components with the aid of these circuits, as well as the safety of the device.

DETAILED DESCRIPTION OF THE INVENTION

Figure 1:
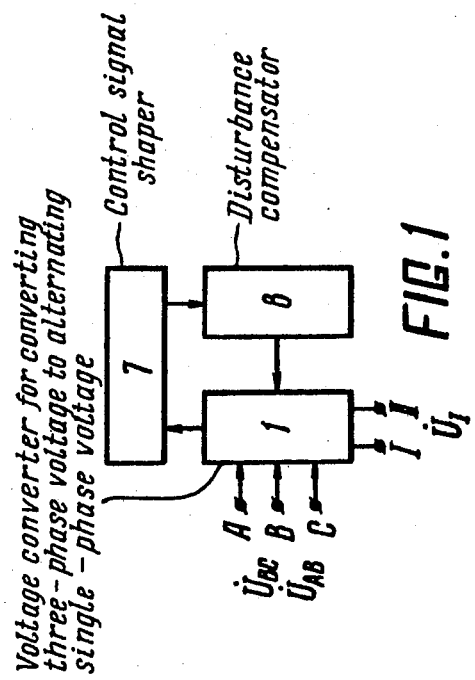
FIG. 1 is a block diagram illustrating how a method of the invention can be embodied.

A block diagram shown in FIGS. 1-3 includes a voltage converter 1 electrically connected to phases A, B and C of a supply-line and adapted to convert a three-phase supply-line voltage to alternating single-phase voltage, which incorporates at least two function generators 2, 3 one of which generators (FIG. 2) or both (FIG. 3) are made in the form of an active-reactive circuit 4 having an active and reactive element 5, 6 respectively, a control signal shaper 7 proportional to disturbances influencing the output voltages of the active-reactive circuits, and a disturbance compensator 8 made in the form of at least one adder 9.

The active-reactive circuit 4 comprises a circuit exhibiting inductive and/or capacitive reactance which can be electrically varied, as is well known in the art. See, e.g., FIG. 4 of FRG Pat. No. 2,220,990, circuit $36^1$ and the circuit including the elements 32 and 28.

The function generator 2 may be in the form of the aforementioned active-reactive circuits, while the function generator 3 may be in the form of a resistance divider such as the circuit including the elements 44 and 48 of FRG Pat. No. 2,220,990.

Figure 4:
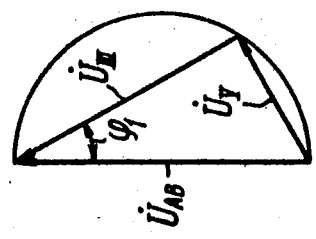

As shown in FIGS. 4 and 5 of the drawing, the function generator 2 divides the amplitude of the input thereto by a factor of N, and shifts the input signal in phase through an angle 1 or 2.

The function generator 3 merely divides the amplitude of the input signal thereto by a desired factor.

While in FIGS. 2, 3, 6, 7 and 10 to 17 of the drawing the reactive elements 6 are shown for convenience as resistors, they are in fact capacitive or inductive reactive elements, as hereinafter described.

The control signal shaper 7a in FIGS. 6 and 7 to 15 of the drawing is a frequency-to-code converter which may be of the type described in U.S. Pat. No. 4,144,489.

Figures 15, 17:
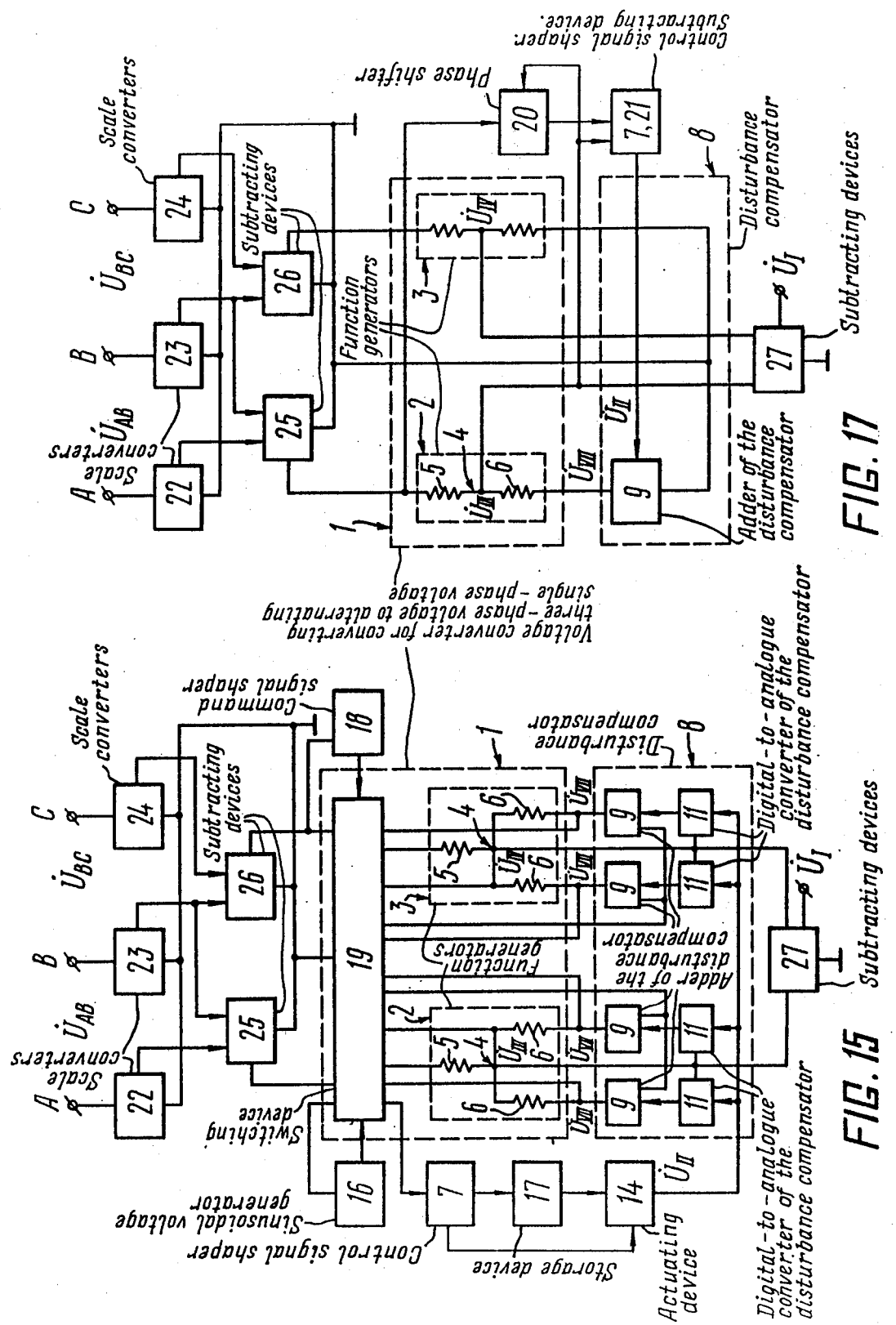
FIG. 15 is the same as in FIG. 14, including additional scale converters and subtracting devices.
FIG. 17 is the same as in FIG. 16, including additional scale converters and subtracting devices.

The control signal shaper 7b as shown in FIGS. 16 and 17 of the drawing may comprise an alternating current differential amplifier of the type described in the book entitled "Operational Amplifiers—Design and Applications", Gerald G. Graeme, Gene E. Tobey, Lawrence P. Huelsman, McGraw-Hill Book Co., New York, 1971, page 245, FIG. 6.23.

The disturbance compensator 8a as shown in FIGS. 2, 3, 6, 7, 16 and 17 of the drawing may comprise an adder of the type described in U.S. Pat. No. 3,747,026.

Figure 9:
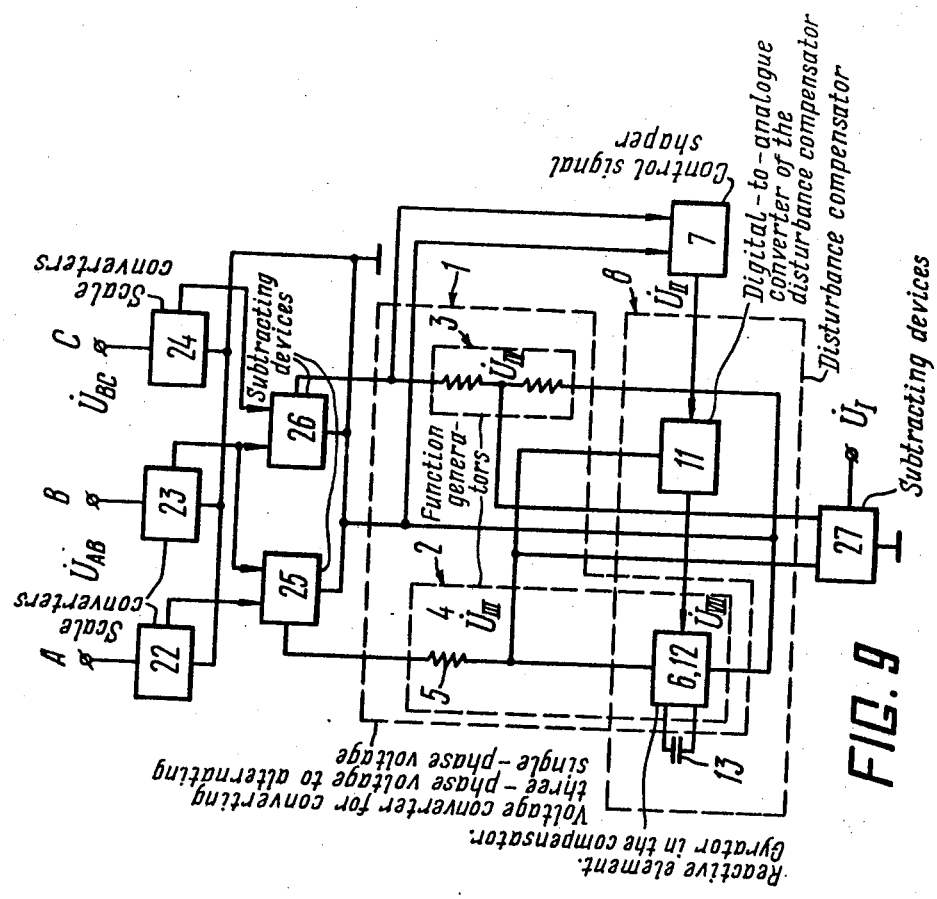
FIG. 9 is the same as in FIG. 8, but provided with additional scale converters and subtracting devices.
Figure 8:
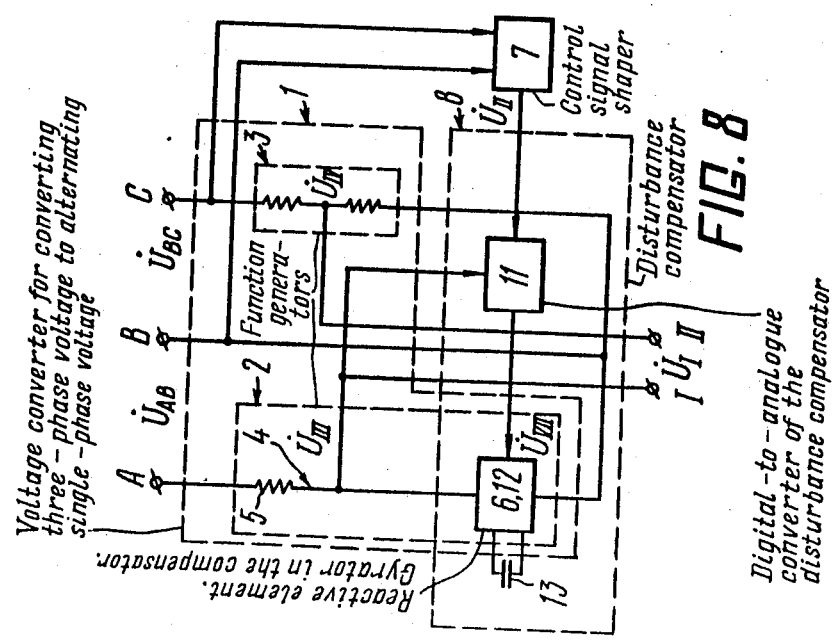
FIG. 8 is a functional diagram of a device for carrying out another modification of a method of the invention.

The disturbance compensator 8b as shown in FIGS. 8 and 9 of the drawing may comprise the circuit shown in U.S. Pat. No. 3,758,885.

The disturbance compensator 8c shown in FIGS. 10 and 11 of the drawing may comprise a resistor matrix of the type shown in U.S. Pat. No. 3,755,807.

The disturbance compensator 8d as shown in FIGS. 12, 13, 14 and 15 may comprise a digital to analogue converter of the type shown in U.S. Pat. No. 3,696,407, or of the type described in British Pat. No. 885,518. In said figures, the adder 9 may be of the type described in U.S. Pat. No. 3,747,026.

Converting three-phase voltage to alternating single-phase voltage by the voltage converter is done with the use at least two function generators 2, 3 (FIGS. 1-3) by varying a supply-line voltage in amplitude and phase in the active-reactive circuits 4, whereafter the output voltages of the function generators 2, 3 are added to produce symmetrical components of a three-phase voltage. Adding said voltages is effected with the function generators being connected in series and the output signals taken from their outputs.

A mathematical representation of the conversion of three-phase voltage to alternating single-phase voltage and summation of output voltages of the function generators take form.

$$U'_I = U'_{III} + U'_{IV} = U'_{AB}K'_1 + U'_{BC}K'_2 \tag{1}$$

where $U'_I$ is a voltage equal to the sum of output voltages of two function generators;

$U'_{III}$, $U'_{IV}$ are output voltages of the function generators 2, 3;

$U'_{AB}$, $U'_{BC}$ are linear voltages of a supply-line;

$K'_1$, $K'_2$ is a gain factor of the function generators 2, 3.

In the general case the gain factors ($K_1$, $K_2$) of the function generators may be expressed by the equations:

$$K'_1 = K_1 \rho^{j\phi_1}; \tag{2}$$

$$K'_2 = K_2 \rho^{j\phi_1}, \tag{3}$$

where $K_1$, $K_2$ are moduli of the gain factors of the function generators (2), (3);

$\phi_1$ $\phi_2$ are phase shift angles of the linear voltages in a supply-line after their having been converted by the function generators 2, 3.

If only one active-reactive circuit 4 (FIG. 2) is used, then as a second function generator 3 use may be made of a scale converter having $\phi_2 = 0$, in which case $$K_2 = K'_2 \rho^{j0} = N_o \tag{4}$$

where N is a gain factor of the scale converter.

Resolution of a supply-line linear voltage into symmetrical components (of. L. A. Bessonov. Teoretitcheskie osnovy electrotehniki, Vyssahja shkola, M., 1962) will result in $$U'_I = (U'_+ + U'_{31})K_1 + (U'_+ a^2 + U'_- a)$$
$$K'_2 = U'_+ (K'_1 + a_2K_2) + U'_- (K'_1 + aK'_2) \tag{5}$$

where $U_+, U_-$ are symmetrical components of the positive and negative sequences;

$a = \rho^{j120°}$ is an operator of shifting a three-phase voltage system.

As can be seen from the equation (5), detecting a voltage proportional to the negative sequence component at the output of the voltage converter 1 is possible only if the following conditions are satisfied:

$$K'_1 + a^2K_2 = 0 \tag{6}$$

$$K'_1 + aK'_2 = \text{const} \tag{7}$$

The latter equations are true provided that the gain factors $K_1$, $K_2$ and the angles of phase shift are constant.

To compensate disturbances influencing the output voltage of the active-reactive circuits first a control signal proportional to said disturbance is formed in the control signal shaper 7 on the basis of the difference of voltage drops across the elements 5, 6 of the active-reactive circuits 4. The compensation of said disturbance influence is effected by summing up voltages applied to the adder 9 of the compensator 8 from the output of the control signal shaper 7 and voltage drops across the elements 5 and 6 of the function generators 2 (FIG. 2). While compensating the disturbance influence the gain factors $K_1$, $K_2$ and the phase shift angles $\phi_1$, $\phi_2$ must remain constant.

The gain factors of the function generators 2, 3 (FIG. 2) are determined from the equations:

$$K_1 = \frac{U_{III}}{U_{AB}} = \frac{U_{IV} + U_{VII}}{U_V + U_{VI} + U_{VII}}, \tag{8}$$

$$K_2 = \frac{U_{IV}}{U_{BC}} = \frac{U_{IX}}{U_{VIII} + U_{IX}} = N_2 \tag{9}$$

and for the diagram in FIG. 1b $$K_1 = \frac{U_{III}}{U_{AB}} = \frac{U_{VI} + U_{VII}}{U_V + U_{VI} + U_{VII}} \tag{10}$$

$$K_2 = \frac{U_{IV}}{U_{BC}} = \frac{U'_{VI} + U'_{VII}}{U'_V + U'_{VI} + U'_{VII}} \tag{11}$$

where $U'_V$, $U'_{VI}$ = voltage drop across the corresponding elements of the function generator 2;

$U'_{V}{}'$, $U'_{VI}{}'$ = voltage drop across the elements of the function generator 3;

$U'_{VIII}$, $U'_{IX}$ = voltage drop across the elements of the function generator 3, made in the form or a scale converter;

$U'_{VII}$, $U'_{VII}{}'$ = compensation voltages of the first and the second adders 9 of the compensator 8, with $U'_{VII} = K_o U'_{II}$, where $K_o$ is a gain factor of the compensator 8, and $U'_{II}$ is a control signal.

The condition of a constant relation between the voltage drops across the elements 5, 6 of the active-reactive circuits 4 may be represented by the following equations:

$$U'_V = N'_1(U'_{VI} + U'_{VII}) \tag{12}$$

$$U'_{V}{}' = N'_1{}'(U'_{VI}{}' + U'_{VII}{}') \tag{13}$$

wherefrom:

$$U_{VII} = \frac{U_V - N_1 U_{VI}}{N_1}; \tag{14}$$

$$U'_{VII} = \frac{U'_V - N'_1 U'_{VI}}{N'_1} \tag{15}$$

where $N'_1$, $N'_1{}'$ are constant coefficients equal to the relation of resistances of the active and reactive elements in the absence of disturbance influence.

Substitution of the voltage value across the compensators into the equations (8), (10), (11) results in $$K_1 = \frac{U_{VII} + \dfrac{U_V - N_1 U_{VI}}{N_1}}{U_V + U_{VI} - \dfrac{U_V - N_1 U_{VI}}{N_1}} = \frac{1}{N_1 + 1} \tag{16}$$

$$K_2 = \frac{\dfrac{U'_V - N'_1 U'_{VI}}{N_2}}{U'_V + U'_{VI} + \dfrac{U'_X - N'_1 U'_{VI}}{N'_1}} = \frac{1}{N'_1 + 1} \tag{17}$$

From equations (9), (16), (17) it follows that the gain factors of the function generators 2, 3 are constants, since $N'_1$, $N'_1{}'$ are constants which are determined by the relation between the elements 5, 6 of the function generator 2 in the absence of destabilizing factors.

As can be seen from the vector diagrams of the active-reactive circuits (FIGS. 4, 5) the phase shift angles $\phi_1$, $\phi_2$ between linear voltages $U_{AB}$, $U_{BC}$ in the supply-line and output voltages $U_{III}$, $U_{IV}$ of the function generators can be found from the formula:

$$\phi_1 = \arccos \frac{U_{III}}{U_{AB}} = \arccos K_1 \tag{18}$$

$$\phi_2 = \arccos \frac{U_{IV}}{U_{BC}} = \arccos K_2 \tag{19}$$

where $U_{III}$, $U_{IV}$ are effective values of the output voltages of the active-reactive circuits;

$U_{AB}$, $U_{BC}$ are effective values of linear voltages of the supply-line.

Since the gain factors $K_1$, $K_2$ are constants the phase shift angles $\phi_1$ and $\phi_2$ are also constants.

Thus, the formation of a control signal from the difference in voltage drop between the elements of the active-reactive circuits and summing up the control voltages and the voltage drops across the corresponding elements 5, 6 of the active-reactive circuits 4, allows the influence of destabilizing factors (such as frequency, temperature and time factors) upon gain factors $K_1$, $K_2$ of the active-rective circuits 4 to be removed, which in turn makes it possible to eliminate the influence of destabilizing factors on the output voltage of the voltage converter for converting three-phase voltage to alternating single-phase voltage, which alternating single-phase voltage is a voltage of one of the symmetrical components, multiplied by a proportionality factor.

In one modification of the proposed method the control signal is formed proportionally to the frequency departure, in which case the control signal shaper 7 (see a block diagram in FIG. 1) is made in the form of a frequency departure converter.

A device to carry out the above modification of the proposed method, which is illustrated in FIG. 6, comprises a voltage converter electrically connected to the phases A, B, C of a supply-line and adapted to convert three-phase voltage to alternating single-phase voltage, which voltage converter includes at least two function generators 2, 3, with at least one of said function generators being an active-reactive circuit 4, a control signal shaper 7a which is a converter adapted to convert a frequency to a control voltage, at least one amplifier 10 having a control input, and a compensator 8a constructed in the form of at least one adder 9, with the number of said adders depending on the number of the active-reactive circuits 4.

The amplifier 10 may be of the type shown in U.S. Pat. No. 3,758,871.

In this case the voltage converter 1 has its inputs connected to the phases of a supply line, the converter 7a has its inputs connected to the inputs of the voltage converter 1 and the output connected to the control input of the amplifier 10 having its signal inputs connected to one of the elements 5, 6 of the active-reactive circuit and its output connected to one lead of the adder 9 of the disturbance compensator 8a, which adder 9 has its other lead connected in series to that element of the corresponding active-reactive circuit, to which is connected a signal input of the amplifier 10, whereas the third lead of said adder 9 is an input of the voltage converter 1 for converting three-phase voltage to alternating single-phase voltage, said input being connected to one of the phases of said supply line, and the outputs of the function generators are electrically connected to the information outputs of the device. The reactive element 6 of the active-reactive circuit 4 is an inductance.

The device of the invention operates in the following manner. When the inputs of the three-phase voltage converter 1 are connected to a three-phase supply-line, at the output of said converter there appears a signal in complience with equation (1). The gain factors of the function generators 2, 3 are determined from the equations (8) and (9). The compensating voltage $U_{VII}$ can be calculated with the following expression:

$$U'_{VII} = U'_{VI}k_3 = U'_{VI} \cdot U'_X = U_{VI}\alpha k_4 \Delta\omega \quad (20)$$

where $k_3 = \alpha U_X$ is an amplifier gain factor;

$\alpha$ is a proportionality factor;

$U_X = k_4\Delta\omega$ is an output voltage of the frequency-to-voltage converter;

$k_4$ is a gain factor of the converter 2;

$\Delta\omega$ is a departure of the frequency $\omega$ of a three-phase voltage from its nominal value $\Omega_o$.

To produce equation (12) the gain factors $\alpha$ and k are selected so that their product is equal to 1:

$$\alpha k_4 = 1 \frac{1}{Hz}$$

Assume that the element 5 is an active resistance (R) and the element 6 is an inductive reactance ($\Omega L$). Detecting the symmetrical components requires that the following condition be complied with:

$$j\omega L = RN'_1 \text{ or} \quad (21)$$

$$U'_V = U'_{VI} \cdot N'_1 \quad (22)$$

where L is an inductance of the active-reactive circuit $$U'_{VI} = \phi'_{AB}R, \; U'_V = \phi'_{AB}j\omega L,$$

where $\phi'_{AB}$ is a vector of the current flowing through the active-reactive circuit and the compensator 8, connected to the phases "A" and "B" of the supply line.

In reality, equations (21), (22) are satisfied only at a nominal value of the supply-line frequency.

In the case of the supply-line frequency departure, the equation (12) is true and in this particular case may be expressed in the following form $$\phi'_{AB}j\Omega L = N'_1(\phi'_{AB}R + \phi'_{AB}R\Delta\Omega\alpha k), \text{ or as}$$

$$\phi'_{AB}j\omega L = J_{AB}j\Delta\omega L = N'_1\phi'_{AB}R + N'_1\phi'_{AB}R\Delta\omega\alpha k_4 \quad (23)$$

$$\phi_{AB}R\Delta\omega\alpha k_4 = U_{VII} \equiv \frac{\phi_{AB}j\omega_o L}{N_1} \mp \frac{\phi_{AB}j\Delta\omega L}{N_1} = \quad (24)$$

$$-\phi_{AB}R = U_V/N_1 - U_{VI}$$

Thus, the control voltage is formed from the difference between the voltage drops across the elements 5, 6 of the active-reactive circuit proportionally to the departure of the frequency from its nominal value, and the stability of the output voltages of the function generators 2, 3 is determined by the stability of the gain factor of the active-reactive circuit 4:

$$K_1 = \frac{\phi_{AB}R + \dfrac{\phi_{AB}j\omega_o L}{N_1} + \dfrac{\phi_{AB}j\Delta\omega L}{N_1} - \phi_{AB}R}{\phi_{AB}j\omega_o L + \phi_{AB}j\Delta\omega L + \phi_{AB}R + \dfrac{\phi_{AB}j\omega_o L}{N_1} + \dfrac{\phi_{AB}j\Delta\omega L}{N_1} - \phi_{AB}R} = \frac{1}{1 + N_1} \quad (25)$$

In another modification of the method, the formation of the control signal from the difference between voltage drops across the elements 5, 6 of the active-reactive circuit 4 is done proportionally to the departure of a period from its nominal value. The control signal shaper 7a according to this modification of the method is an digital-to-analogue converter adapted to convert a period to a control signal.

A device to realize this modification of the proposed method is shown in FIG. 8. It also comprises a voltage converter 1 electrically connected to the phases of a supply-line and adapted to convert three-phase voltage to alternating single-phase voltage, which voltage converter including at least two function generators 2, 3, with at least one of said function generators being an active-reactive circuit 4, a control signal shaper 7a to form a control signal proportional to a disturbance influence, and a disturbance compensator 8b. The disturbance compensator 8b is made up of connected in series at least one digital-to-analogue converter 11, at least one gyrator 12 which also serves as a reactive element of the corresponding active-reactive circuit, and at least one capacitor 13 connected to the output of the corresponding gyrator 12.

The control signal shaper 7a made in the form of an digital-to-analogue converter for converting a period to a control signal has its inputs connected to the phases of a supply line and its outputs connected to the first input of the corresponding digital-to-analogue converter 11 having its second input connected to the output of the active-reactive circuit 4 and its output connected to the control input of the corresponding gyrator 12, which gyrator 12 is connected in series with the corresponding element 5 of the active-reactive circuit 4. The outputs of the function generators 2, 3 are electrically connected to the information outputs of the device.

The above device operates as follows. The output voltage of the voltage converter 1 is determined by expression (1). The gain factors of the function generators 2, 3 are expressed by equations (8) and (9). Assume that a voltage drop across the reactive element 6 of the active-reactive circuit 4 is $U_{VI}$, and a voltage drop across the active element 5 of said circuit is $U_V$. In this case the voltage drop across the reactive element, i.e. gyrator 12 will be $$U'_{VI} = U'_{XI} = K_5 U'_{XII} \quad (26)$$

where

U'$_{XI}$ is a voltage at the inputs of the gyrator 12;
K$_5$ is a gain factor of the gyrator 12;
U'$_{XII}$ is an output voltage of the gyrator 12.

As to the output of the gyrator 12 is connected the capacitor 13 the output voltage of said gyrator is $$U_{XII} = \phi_I \frac{1}{\omega C} = \phi_I \frac{T_o}{2\pi C} \pm \phi_I \frac{\Delta T}{2\pi C} \quad (27)$$

where

To is a nominal value of a supply-line period;
ΔT is a departure of the period from its nominal value;
$\phi_I$ is a current at the output of the gyrator; $\phi'$
C is a capacitance of the capacitor 13 connected to the output of the gyrator 12.

The condition of a constant relationship between the voltage drops across the active element 5 and the reactive element 6 in the active-reactive circuits 4 takes form $$U'_{VI} = N'_1 U_V = N'_1 Y'_{AB} R = U'_{XIII} \quad (28)$$

where

R is an active resistance of the active-reactive circuit 4;
U'$_{XIII}$ is a voltage at the input of the gyrator 12 when a period of said supply line has its nominal value:

$$U_{XIII} = K_5 \phi_1 \frac{T_o}{2\pi C} \quad (29)$$

In this case the control voltage should be equal $$U_{VII} = U_{XI} - U_{XII} = K_6 K_5 \phi_1 \frac{\Delta T}{2\pi C} \quad (30)$$

where K$_6$ is a gain factor of a series circuit made up of the digital-to-analogue converter 11 and the adder 9.

Summing up the compensating voltage U$_{VII}$ (taken with an appropriate sign) and the voltage drop across the capacitor 13 connected to the output of the gyrator 12 results in $$U_{XII} = \phi_1 \frac{T_o}{2C} \pm \phi_1 \frac{\Delta T}{2\pi C} \mp K_6 K_5 \phi_1 \frac{\Delta T}{2\pi C} \quad (31)$$

If a conversion factor K$_6$ of a series circuit made up of the digital-to-analogue converter 11 and the adder 9 is selected equal to 1/K$_5$, then $$U_{VII} = \phi_1 \frac{\Delta T}{2\pi C}, \text{ and} \quad (32)$$

$$U_{XII} = \phi_1 \frac{T_o}{2\pi C} = \text{const}, \quad (33)$$

in which case $$U'_{XI} = U'_{XIII} = K_5 U'_{XIII} = \text{const} \quad (34)$$

The gain factor of the active-reactive circuit 4 is equal $$K_1 = \frac{U_{XI}}{U_{XI} + U_V} = \frac{N}{N_1 + 1} \quad (35)$$

Thus, in the case of a departure of the period from its nominal value the gain factor of at least one active-reactive circuit 4 remains constant, which permits frequency errors in detecting symmetrical components to be eliminated.

Another device for carrying out this modification of the proposed method also comprises a voltage converter electrically connected to phases A, B and C of a supply line and adapted to convert three-phase voltage into alternating single-phase voltage, which voltage converter including at least two function generators 2, 3, at least one of said function generators being an active-reactive circuit 4, a control signal shaper 7a adapted to form a control signal proportional to a disturbance influence, a disturbance compensator 8c. The device is further provided with an actuating device 14. The control signal shaper is made of an digital-to-analogue converter adapted to convert periods to control signals, and the disturbance compensator 8c is made in the form of at least one resistance matrix 15. The disturbance compensator 8c has its one lead connected to the active element 5 of the corresponding active-reactive circuit 4, the digital-to-analogue converter has its input connected to the phase of a supply line and its output connected to the input of the actuating device 14 having its output connected to the second lead of said disturbance compensator 8c which lead serves as its control input. The third lead of the disturbance compensator 8 is an input of the voltage converter 1 and is connected to one of said supply line phases. The function generators 2, 3 have their outputs electrically connected to the information outputs of the device.

The above device operates in the following manner. A three-phase voltage applied to the inputs of the voltage converter 1 is converted by the function generators 2, 3 in accordance with expression (1). The condition of constant gain factors of the active-reactive circuits 4 in accordance with expressions (8), (9) is achieved by summing up the control voltages and the voltage drops across the corresponding elements in the active-reactive circuits. Forming the control voltages from the difference in voltage drop between said elements in the active-reactive circuits 4 is done proportionally to the departure of the period from its nominal value. In the case of using only one active-reactive circuit 4 the stability of the gain factor of the scale (function) generator 3 is attained by using precision elements in said generator.

From condition (12) of the stability of the relation between the voltage drops across the elements 5, 6 in the active-reactive circuits follows $$N'_1 U'_{VII} = U'_V - N' U_{VI} = Y_{AB} 1/(j\omega c) - N'_1 \phi_{AB} R \quad (36)$$

where

U$_V$ is a voltage drop across the reactive element 6, i.e. capacitor (C);
U$_{VI}$ is a voltage drop across the active resistance (R);
I$_{AB}$ is a current flowing through the active-reactive circuit connected to phases A and B;
N is a coefficient equal to the resistance ratio of the elements of the active-reactive circuit 4, when the nominal frequency value is N=1/(jω$_o$C):R.

Expression (36) may have the following form $$N_1 U_{VII} = \phi_{AB}\frac{T_o}{j2C} + I_{AB}\frac{\Delta T}{j2\pi C} - N_1\phi_{AB}R = \phi_{AB}\frac{\Delta T}{j2\pi C} \quad (37)$$

where
To=(2π/(Wo)) is a nominal value of the period;
ΔT is a departure of the period from its nominal value.

As follows from the above equation the control voltage formed from the difference in voltage drop between the active and reactive elements in the active-reactive circuit 4 is proportional to the departure ΔT of the period T from its nominal value To.

The formation of such voltage is effected by that a code No is formed in the resistance matrix 15 of the digital-to-analogue converter, which code being equal $$N_o = K_7 \Delta T, \quad (38)$$

where $K_7$ is a conversion factor of the digital-to-analogue converter (1/sek).

The said code is transmitted to the actuating device 14 wherein said code is stored during a voltage oscillation period and simultaneously is applied to the second lead of the compensator which is a resistance matrix 15 whose resistance ΔR is $$\Delta R = N_o R_i = K_7 \Delta T R_i, \quad (39)$$

where $R_i$ is a resistance of the matrix 15 if the code at the output of the actuating device has "1" in the less significant digit.

The compensating voltage of the disturbance compensator 8 is $$U_{VII} = \phi_{AB}\Delta R = \phi_{AB}K_7 \Delta T R_i = \phi_{AB}\cdot\frac{\Delta T}{N_1 j2\pi C} \quad (40)$$

wherefrom $$K_7 R_i = \frac{1}{N_1 j 2\pi C}, \quad (41)$$

When the values $U_V$, $U_{VI}$ and $U_{VII}$ are substituted in expression (16) the latter takes the following form $$K_1 = \frac{\phi_{AB}\dfrac{T_o}{jN_1\pi C} + \phi_{AB}\dfrac{\Delta T}{jN_1 2\pi C}}{\phi_{AB}\dfrac{T_o}{j2\pi C} + \phi_{AB}\dfrac{T_o}{jN_1 2\pi C} + \phi_{AB}\dfrac{\Delta T}{jN_1 2\pi C}} = \frac{1}{N_1 + 1} \quad (42)$$

Thus, forming the control signal proportionally to the supply-line period departure which is effected by means of an digital-to-analogue conversion of said period and controlling the resistance matrices with the aid of the actuating device 14 permits maintaining constant the gain factor of the active-reactive circuit 4 when the supply-line frequency varies, and thus preventing said frequency variation from affecting the accuracy in detecting symmetrical components.

A device to carry out this modification of the proposed method is possible, which comprises a voltage converter 1 electrically connected to phases A, B and C of a supply-line (FIG. 12), and adapted to convert three-phase voltage to alternating single-phase voltage, said voltage converter including at least two function generators being an active-reactive circuit 4, a control signal shaper 7a adapted to form control signals proportional to a disturbance influence, and a disturbance compensator 8d made in the form of at least one adder 9. The device is additionally provided with a sinusoidal voltage generator 16, a storage device 17, an actuating device 14, and a command signal shaper 18, and the voltage converter 1 further includes a switching device 19 whose first leads serve as inputs of said voltage converter 1. The disturbance compensator 8d also includes at least one digital-to-analogue converter 11, and the control signal shaper is made in the form of an digital-to-analogue converter adapted to convert periods into control signals.

Each digital-to-analogue converter 11 of the disturbance compensator 8d is connected in series with the first lead of the corresponding adder 9 of the disturbance compensator 8d, which adder 9 having its second lead connected to the active element 5 of the corresponding active-reactive circuit 4. The switching device 19 has its each second lead connected to the output of the active-reactive circuit 4. Each active-reactive circuit 4 has its output connected to the first input of the corresponding digital-to-analogue converter 11. The third leads of the switching device 19 are connected each with the reactive element 6 of the corresponding active-reactive circuit 4, which switching device has its fourth lead connected to the input of the function generator, its fifth lead connected to the output of the command signal shaper 18 having an input connected to the supply-line phase, its sixth leads connected to the terminals of the sinusoidal generator 16, its seventh lead connected to the control signal shaper, and its eighth leads connected to the connection points between each active element 5 and the corresponding adder 9 of the disturbance compensator 8d. The control signal shaper 7a has its first output connected to the input of the storage device 17 having its output connected to the first input of the actuating device 14 having its second input connected to the second output of the control signal shaper 7a, and its output connected to the second input of each digital-to-analogue converter 11. The outputs of the function generators 2, 3 are electrically connected to the information outputs of the device.

The Storage device or memory unit 17 may be of the type shown in U.S. Pat. No. 4,106,109, while the sinusoidal generator 16 may be of the type shown in U.S. Pat. No. 3,935,541.

The above device operates as follows. When a three-phase voltage is applied to the inputs of the voltage converter 1 through the first leads of the switching device 9, through the seventh leads hereof to the input of the control signal shaper 7a of one of linear voltages of said supply-line. Compensating a three-phase voltage frequency departure is accomplished in a manner similar to that described above. In this case, however, the compensating signal $U_{VII}$ is formed in a series circuit made up of a digital-to-analogue converter 11 and the adder 9 in accordance with a code of the actuating device 14, that is $$U_{VII} = U_{VI} N_o K_8 = U_{VI} N_o K_7 K_8 \quad (43)$$

where $K_8$ is a conversion factor of the series circuit including the digital-to-analogue converter 11 and the adder 9.

While compensating temperature and time errors, the switching device 19 in response to a signal applied from the command signal shaper 18 connects through its second, third, fourth and sixth leads the active-reactive circuits 4 to the terminals of the sinusoidal generator 16, in which case the latter generates a sinusoidal voltage with a circular frequency $$\omega_r = \frac{1}{\sqrt{R_5 C_6 R'_5 C'_6}}, \tag{44}$$

where $R_5$, $R'_5$, $C_6$, $C'_6$ are parameters of the corresponding elements of the active-reactive circuit.

The other terminals of the generator 16 are connected, through the seventh leads of the switching device 19, to the input of the control signal shaper 7a.

In this case a code of the digital-to-analogue converter functioning as the control signal shaper 7a is proportional to the departure of the voltage oscillation period of the generator 16, which departure is determined by the temperature and time variations of the reactive elements 6 in the active-reactive circuits 4:

$$T_{oI} \pm \Delta T_I = \frac{\omega_I}{2\pi} = \sqrt{R_5(C_6 \pm \Delta C_6) R'_6 (C'_6 \pm \Delta C'_6)}, \tag{45}$$

where $T_{oI}$ is a period of oscillation of the generator 16 voltage at nominal values of the reactive elements 6 of the active-reactive circuit 4;

$\omega_I$ is a circular frequency of the generator 16 voltage oscillations;

$\Delta T_I$ is the departure of the generator 16 voltage oscillation period from its nominal value;

$\Delta C_6, \Delta C'_6$ is a parameter drift of the reactive elements 6, caused by temperature or time variations.

A code of the digital-to-analogue converter (the control signal shaper 7a) will be $$N = K_7 \cdot \Delta T_I \tag{46}$$

This code is recorded in the storage device 17 till the next switching-over of the device to the mode of compensating temperature and time influencing factors. In the actuating device 14 the code of the storage device is summed up with a code $N_o$, and in the disturbance compensator 8 from the sum of the codes $N + N_o$ a control signal is formed, which control signal is used to eliminate frequency, temperature and time errors of the device.

The transmission factors of the function generators 2, 3 remain constant and being equal $\check{K}'_1 = 1/(1+N_1)$, which is indicative of that there is no errors in detecting symmetrical components.

A device for carrying out this modification of the proposed method is also possible which, like the previous one, includes a voltage converter 1 (FIG. 14) electrically connected to the phases of a supply line and adapted to convert three-phase voltage to alternating single-phase voltage, which voltage converter includes two function generators 2, 3 which are active-reactive circuits 4, a control signal shaper 7c adapted to form control signals proportional to a disturbance influence, a disturbance compensator 8d which is an adder 9.

This device further includes a command signal shaper 18, a sinusoidal voltage generator 16, a storage device 17 and an actuating device 14. The disturbance compensator 8d is further provided with four digital-to-analogue converters 11 and three adders 9. The voltage converter 1 includes a switching device 19, and each active-reactive circuit of this voltage converter is additionally provided with a reactive element 6, one of which reactive elements is of a capacitance-type and the other one is of an induction-type, for instance, on the basis of a controlled gyrator. The control signal shaper is made in the form of an digital-to-analogue converter adapted to convert periods into control signals. The first inputs of the switching device 19 are inputs of said voltage converter.

The reactive elements 6 in each active-reactive circuit 4 have their first leads connected to each other and to the output of their active-reactive circuit 4. Each said digital-to-analogue converter 11 incorporated in the disturbance compensator 8d has its output connected to the first lead of the corresponding adder 9. The first inputs of each two digital-to-analogue converters are connected to the output of the corresponding active-reactive circuit 4, and the second leads of the adders 9 connected to these digital-to-analogue converters 11 are connected to the second leads of the reactive elements 6 of the same active-reactive circuit. The switching device 19 has its second leads connected to the outputs of each said active-reactive circuit 4, its third leads connected to the leads of the active elements 5 of the active-reactive circuits 4, its fourth lead connected to the output of the command signal shaper 18, its fifth leads connected to the terminals of the sinusoidal voltage generator 16, its sixth lead connected to the input of the control signal shaper 7a, its seventh leads connected to the connection points of the second lead of each said reactive element 6 in each active-reactive circuit 4 and of the second lead of the corresponding adder 9, and its eighth leads connected to the third lead of each adder 9. The first output of the control signal shaper 7a is connected to the input of the storage device 17 having its output connected to the first input of the actuating device 14 having its second input connected to the second output of the control signal shaper 7a, and its output connected to the second input of each digital-to-analogue converter 11. The outputs of the function generators 2, 3 are electrically connected to the information outputs of the device.

This modification of the device operates in a manner similar to that described in the previous case. A three-phase voltage is applied to the input of the voltage converter 1 through the first leads of the switching device 19. Compensating temperature and time errors is done as disclosed above.

The influence of higher harmonics is decreased by that each of two said active-reactive circuit 4 includes a reactive element. In this case the reactive elements 6 of the active-reactive circuits 4 are selected so that at the nominal frequency of the circuit one of two oscillatory circuits made up of two reactive elements 6 and two adders 9 is capacitive in effect, while the other oscillatory circuit exhibits an inductive reactance, with the resistances of said oscillatory circuits being equal as to their modulus, and differing N times from active resistances of the corresponding active-reactive circuits 4.

Stabilizing the gain factors of the active-reactive circuits is done by summing up the control voltages produced from the difference in voltage drop between the elements 5, 6 of each active-reactive circuit 4 proportionally to the departure of the period from its nominal value in the digital-to-analogue converter of the signal shaper 7a whose code is applied, through the storage device 17 and the actuating device 14, to the input of the digital-to-analogue converters 11. Depending on the departure of the supply-line period from its nominal value the digital-to-analogue converters produce a compensating voltage which are summed up by the adders 9 with the voltage drop across each reactive element of the active-reactive circuit 4, which results in that the voltage drops across the reactive elements 6 of the active-reactive circuits are stabilized and the gain factors thereof maintained constant in the presence of destabilizing factors.

Thus, the use of two additional reactive elements 6 makes it possible to decrease the influence of the higher harmonics, while the presence of the additional digital-to-analogue converters 11 and adders 9 connected in an appropriate manner to the control signal shaper 7a and to the active-reactive circuits 4 permits the influence of the destabilizing factors to be eliminated and the accuracy in detecting symmetrical components to be greatly improved as a result.

In a modification of the proposed method of detecting symmetrical components of a three-phase voltage the formation of a control signal from the difference in voltage drop between the active and reactive elements 5, 6 in each active-reactive circuit 4 is accomplished by shifting a voltage drop vector of one of the elements in the active-reactive circuit 4, subsequently altering it in amplitude according to the relationship between the voltage drops across active and reactive elements 5, 6 of said circuit 4, and subtracting the same from a vector of the voltage drop across the other element of the same circuit.

A device to carry out this modification of the proposed method is illustrated in FIG. 16. The device comprises a voltage converter 1 adapted to convert three-phase supply-line voltage to alternating single-phase voltage and electrically connected to the phases of said supply line, which voltage converter 1 includes at least two function generators 2, 3, with at least one of said function generators being an active-reactive circuit 4, a control signal shaper 7b adapted to form a control signal proportional to a disturbance influence, a disturbance compensator 8a made in the form of at least one adder 9. The device additionally includes at least one phase shifter. The control signal shaper 7b includes at least one subtracting device 21. Each said phase shifter 20 has its input connected to one active element 5 of the corresponding active-reactive circuit 4, and its output connected to the first input of the corresponding subtracting device 21 having its second input connected to the other element 6 of the same active-reactive circuit 4. The output of each said function generators 2, 3 is electrically connected to the information output of the device.

The above device operates in the following manner. When a three-phase voltage is applied to the inputs of the active-reactive circuits 4, the vector of the voltage drop across one of the elements in said active-reactive circuit 4, connected to the inputs of the phase shifter 20, is shifted in phase to $\pi/2$ and alters in amplitude so that in the absence of destabilizing factors.

$$U_{XIV}=N_1U_V=U_{VI}, \quad (47)$$

where $U_{XIV}$ is an output voltage of the phase shifter 20.

In this case no compensating voltage is applied from the output of the subtracting device 21. Under the influence of disturbance equation (46) is disturbed, as a result of which $$U_{VII}=U_{XV}=N_1U_V-U_{VI}, \quad (48)$$

where $U_{XV}$ is an output voltage of the subtracting device 21, in which case the gain factor of the active-reactive circuit 4 in complience with the expression (8) is $$K_1 = \frac{U_{VI} + N_1U_V - U_{VI}}{U_V + U_{VI} + N_1U_V - U_{VI}} = \frac{N_1}{1+N_1} \quad (49)$$

As can be seen from expression (49) the gain factor of the active-reactive circuit 4 is not influenced by the disturbance action, which favours a higher accuracy in detecting symmetrical components.

It is expedient that all the above devices for detecting symmetrical components of a three-phase voltage also include three scale converters 22, 23, 24 (FIGS. 7, 9, 11, 13, 15, 17) and three additional substracting devices 25, 26, 27. The outputs of two said scale converters 22, 24 are connected to the first inputs of two additional subtracting devices 25, 26. The output of the third scale converter 23 is connected to the other two inputs of these two additional subtracting devices 25, 26 having their outputs connected to the inputs of the voltage converter 1. The function generators 2, 3 have their outputs connected to the inputs of the third subtracting device 27 whose one output serves as an information output of the device. All the three scale converters have their first inputs connected to the phases of a supply line. The second inputs of the scale converters 22, 23, 24, the inputs of the function generators 2, 3 and the second outputs of the subtracting devices 25, 26, 27 and earthed.

The operation of the above devices has been already described. The presence of three scale converters connected to the phases of a supply-line, two subtracting devices connected to the leads of the scale converters 22, 23, 24 allows the formation of linear voltages from the phase voltages according to the following formulae $$K_8U_{AB}=K_8U_B-K_8U_A, \quad (50)$$

$$K_8U_{BC}=K_8U_B-K_8U_C,$$

where $K_8$ is a division ratio of the scale converters;

$U_A$, $U_B$, $U_C$ are supply-line phased voltages.

As a result of such conversion the phase B potential is "zero", which allows one of the outputs of each said function generators 2, 3, connected to the phase B to be earthed, which improves the safety of operation of said three-phase voltage converter.

The presence of the third subtracting device having its leads connected to the outputs of the function generators 2, 3 makes it possible to considerably reduce capacitive induction when said three-phase voltage converter operates close to sources of strong electromagnetic fields.

The output voltages of the function generators 2, 3 in the presence of noise can be expressed as follows:

$$U_{III} = U_{VI} + U_{XVI}$$

$$U_{IV} = U_{VI} + U_{XVI} \tag{51}$$

where $U_{XVI}$ is a capacitive induction voltage.

As a result of summing up output voltages of the function generators 2, 3, which summing-up of the voltages being one of the steps in the conversion of three-phase supply-line voltage to alternating single-phase voltage, a capacitive induction voltage $U_{XVI}$ is present in the output voltage $U_I$ of the voltage converter 1, which affects the accuracy in detecting symmetrical components.

The formation of linear voltages relative the earth potential permits subtracting the output voltage of one function generator from the output voltage of the other function generator, as shown in FIG. 19:

$$U_I = U_{III} - U_{IV} = K_9 \cdot U_{XVII}, \tag{52}$$

where $K_9$ is a proportionality factor;

$U_{XVII}$ is a symmetrical component voltage.

Thus, as can be seen from expression (42) the presence of the three scale converters 22, 23, 24 and three subtracting devices permits the influence of capacitive induction affecting the accuracy of detecting symmetrical components to be eliminated.

We claim:

1. A method of detecting symmetrical components of a three-phase supply-line voltage, comprising:
   converting said supply-line three-phase voltage to alternating single-phase voltage with the aid of at least two function generators coupled to different lines of said three-phase supply line, with at least one of said function generators being an active-reactive circuit comprising an active element and exhibiting inductive or capacitive reactance which can be electrically varied, said voltage conversion being effected by altering the supply-line linear voltage in amplitude and phase with the aid of said active-reactive circuits,
   subsequently summing the output voltages of said function generators to produce voltages comprising symmetrical components of said three-phase voltage,
   generating a control signal proportional to a perturbation in the output voltages of said active-reactive circuits due to an electrical or environmental disturbance, said control signal being equal to the difference in voltage drops between elements in each active-reactive circuit,
   compensating said disturbance by summing said control signal and voltage drop across one of said elements in each active-reactive circuit, and
   displaying or communicating a signal corresponding to the amplitude of at least one of said voltages comprising symmetrical components of said three phase voltage.

2. A method of detecting a signal corresponding to symmetrical components of a three-phase supply-line voltage according to claim 1, wherein said control signal generating step is done proportionally to a frequency deviation of said single-phasing voltage from a reference frequency.

3. A device for determining symmetrical components of a three-phase supply line voltage, comprising:
   a voltage converter for converting a three-phase supply-line voltage to an alternating single-phase voltage and having inputs electrically connected to the phases of said supply-line, said voltage converting including: at least two function generators, with at least one of said function generators being an active-reactive circuit having two inputs and an output and incorporating active and reactive elements, each of said elements having two leads, with one of said two leads of each said element being an input of the corresponding active-reactive circuit, the other leads thereof being connected with each other and their connection point being an output of the corresponding active-reactive circuit and electrically connected to the information output of said device, the other of said function generators also having its output electrically connected to said information output of said device;
   a control signal shaper adapted to form control signals proportional to a disturbance influence and comprising of a frequency converter, for converting frequency to a control voltage, said converter having two inputs connected to the phases of said circuit, and an output;
   at least one amplifier having a control input connected to the output of said frequency converter, a signal input connected to one of said active elements of the corresponding active-reactive circuit, and an output;
   a disturbance compensator comprising at least one adder having three leads, the first said lead connected in series with the lead of that element of the corresponding active-reactive circuit, which is connected to a signal input of said amplifier, the second lead connected to the output of said amplifier, and the third lead being an input of said voltage converter for converting said three-phase voltage to an alternating single-phase voltage, said input being connected to one of the phases of said supply-line.

4. A device for determining symmetrical components of a three-phase voltage, wherein said voltage converter for converting three-phase voltage to alternating single-phase voltage is grounded, said device further including:
   three scale converters each having two inputs and an output, the first input of each scale converters being connected to one of the phases of said supply-line, and the second input being grounded;
   three subtracting devices, each having two inputs and two outputs, the first input of each of two subtracting devices is connected to the output of one of two said scale converters, the second input of each of two subtracting devices connected to the output of the third of said scale converters, the outputs of two said subtracting devices connected to the inputs of said voltage converter for converting three-phase voltage to alternating single-phase voltage, the inputs of the third said subtracting device connected to the outputs of said function generators, said subtracting devices having their outputs being earthed.

5. A method of detecting symmetrical components of a three-phase supply-line voltage according to claim 1, wherein the step of generating a control voltage from the difference between voltage drops across the elements of each active-reactive circuit is done proportionally to a period deviation.

6. A device for determining the symmetrical components of a three-phase voltage comprising:

a voltage converter adapted to convert a three-phase supply-line voltage to alternating single-phase voltage and having inputs electrically connected to the phases of said supply-line, said voltage converter including: at least two function generators having inputs being said inputs of said voltage converter, and an output, with at least one of said function generators being an active-reactive circuit incorporating active and reactive elements, one lead of each of said elements of said active-reactive circuit being an input thereof, and an output of the corresponding function generator, and the other outputs of said elements being connected with each other with their connection point serving as an output of this active-reactive circuit and an output of the corresponding function generator, and being electrically connected to the information output of said device;

a control signal shaper adapted to form a control signal proportional to a disturbance and being made in the form of an analog-to-digital converter for converting a period to a control signal, having an input connected to the phases of said supply-line, and an output;

a disturbance compensator made in the form of at least one digital-to-analog converter having two inputs and an output, one of said inputs being connected to the output of said control signal shaper, and the second said input connected to the output of said active-reactive circuit;

at least one gyrator serving as a reactive element of the corresponding active-reactive circuit and having a control input, two signal inputs and an output, the control input being connected to the output of said digital-to-analog converter, the first signal input being connected to the lead of the active element of the corresponding active-reactive circuit, and the second signal input being one of the inputs of this active-reactive circuit;

at least one capacitor having leads connected to the output of said gyrator.

7. A device according to claim 6, wherein the voltage converter for converting three-phase voltage to alternating single-phase voltage is grounded further comprising three scale converters, each having two inputs and an output, the first input of each said scale converter connected to one of the phases of said supply-line, with the second input being earthed;

three subtracting devices, each having two inputs and two outputs, the first input of each of two subtracting devices being connected to the utput of one of two said scale converters, the second inputs of each two subtracting devices connected to the output of the third said scale converter, with two said subtracting devices having their outputs connected to the inputs of said voltage converter for converting three-phase voltage to alternating single-phase voltage, said thirs subtracting device having its inputs connected to the outputs of said function generators, the second outputs of all the three said subtracting devices being earthed.

8. A device for determining symmetrical components of a three-phase voltage comprising:

a voltage converter for converting a three-phase supply-line voltage to alternating single-phase voltage having inputs electrically connected to the phases of said supply-line, said voltage converter including:

at least two function generators being an active-reactive circuit having two inputs and an output, and incorporating active and reactive elements each having two leads, one lead of each said element being inputs of the corresponding active-reactive circuit, and the other leads are connected to each other to form a connection point which serves as an output of the corresponding active-reactive circuit and of the corresponding function generator, and is electrically connected to the information output of the device, with the output of the other said function generator being also electrically connected to the information output of said device;

a control signal shaper adapted to form a control signal proportional to a disturbance influence and made in the form of an analog-to-digital converter adapted to convert a period to a control signal, having an input connected to the phases of said supply-line, and an output;

an actuating device having an input connected to the output of said control signal shaper, and an output;

a disturbance compensator made in the form of at least one resistance matrix having two signal leads and a control input, one signal lead of each resistance matrix being connected to said active element of the corresponding active-reactive circuit, the second signal lead serving as an input of said voltage converter and being connected to one of the phases of said supply-line, with the control input of said resistance matrix being connected to the output of said actuating device.

9. A device according to claim 8, wherein the voltage converter for converting three-phase voltage to alternating single-phase voltage is grounded, and which device further includes:

three scale converters each having two inputs and an output, the first input of each scale converter being connected to one of the phases of said supply-line, and the second input of each said scale converter being earthed;

three subtracting devices each having two inputs and two outputs, each of two said subtracting devices having its first input connected to the output of one of two said scale converters, the second input connected to the output of said third scale converter, and its output connected to the inputs of said voltage converter, said third subtracting device having its inputs connected to the outputs of said function generators, and the second output of all the three said subtracting devices being earthed.

10. A device for determining symmetrical components of a three-phase voltage comprising:

a voltage converter for converting a three-phase supply-line voltage to alternating single-phase voltage having inputs electrically connected to the phases of supply-line, said voltage converter including:

at least two function generators having inputs and an output, with at least one of said function generators being an active-reactive circuit incorporating active and reactive elements, one lead of each said element being inputs of the corresponding active-reactive circuit and of the corresponding function generator, and the other leads of said elements being connected therebetween, with the point of their connection serving as an output of the corresponding active-reactive circuit and of the corresponding function generator, being electrically connected to the information output of said device, and the output of the other converter being also electrically connected to the information output of said device;

a switching device having a number of leads, the first leads serving as inputs of said voltage converter and being connected to the phases of said supply-line, each of the second leads being connected to the output of the corresponding function generator, and the third lead connected to the lead of said reactive element of the corresponding active-reactive circuit, said lead of said reactive element being an input of one of the function generators, with the fourth lead connected to the input of the other function generator;

a command signal shaper having an input connected to one of the phases of said supply-line and an output connected to the fifth lead of said switching device;

a sinusoidal voltage generator having terminals connected to the sixth lead of said switching device;

a control signal shaper adapted to form control signals proportional to a disturbance influence and made in the form of an analog-to-digital converter to convert periods into control signals, and having an input connected to the seventh lead of said switching device, and a first and a second output;

a storage device having an input connected to the first output of said control signal shaper, and an output;

an actuating device having two inputs, one of said two inputs being connected to the second output of said control signal shaper, and the second input connected to the output of said storage device, and an output;

a disturbance compensator including: at least one digital-to-analog converter having two inputs one of said inputs being connected to the output of the corresponding active-reactive circuit, and the other input of said converter connected to the output of said actuating device, and an output;

at least one adder having three leads, one said lead connected to the output of the digital-to-analog converter, and said second lead connected to the active element of the corresponding active-reactive circuit, with the point of connection of said second lead of the adder and the active element of the corresponding active-reactive circuit being connected to the eighth lead of the switching device, and the third lead of said adder connected to the ninth lead of said switching device.

11. A device according to claim 10, wherein said voltage converter for converting a three-phase supply-line voltage into alternating single-phase voltage is grounded and which device further includes:

three scale converters each having two inputs and an output, the first input of each said converter being connected to one of the phases of said supply-line, and the second input being earthed;

three subtracting devices each having two inputs and two outputs, each of two said subtracting devices having its first input connected to the output of one of two said scale converters, its second input connected to the output of said thirs scale converter, the outputs of said subtracting devices connected to the inputs of said voltage converter, the third of said subtracting devices having its inputs connected to the outputs of said function generators, with the second outputs of all the three said subtracting devices being earthed.

12. A device for determining symmetrical components of a three-phase voltage comprising:

a voltage converter for converting a three-phase supply-line voltage into alternating single-phase voltage having inputs electrically connected to the phases of said supply-line, said voltage converter including:

two function generators each made in the form of an active-reactive circuit incorporating one active and two reactive elements, and having two inputs and one output, one lead of each said element being an input of the corresponding active-reactive circuit and of the corresponding function generator, the other leads of said elements being connected, with their connection point serving as an output of the corresponding active-reactive circuit and of the corresponding function generator, and being electrically connected to the information output of said device;

a switching device having a number of leads, the first leads serving as inputs of said voltage converter and being connected to the phases of said supply-line, the second leads being connected to the outputs of the corresponding function generator, and the third lead connected to the active element of the corresponding active-reactive circuit, said lead of said element being one of the inputs of the corresponding function generator;

a command signal shaper having an input connected to one of the phases of said supply-line and an output connected to the fourth lead of said switching device;

a sinusoidal voltage generator having terminals connected to the fifth lead of said switching device;

a control signal shaper adapted to form a control signal proportional to a disturbance influence and made in the form of an analog-to-digital converter adapted to convert periods into control signals, said control signal shaper having an input connected to the sixth lead of said switching device, and a first and a second outputs;

a storaage device having an input connected to the first output of said control signal shaper, and an output;

an actuating device having two inputs, one said input connected to the second output of said control signal shaper, and the second said input connected to the output of said storage device, and an output;

a disturbance compensator including;

four digital-to-analog converters each having two inputs and an output, the first inputs of each of said two digital-to-analog converters being connected to the outputs of said corresponding active-reactive circuit, and their second inputs connected to the outputs of said actuating device;

four adders each having three leads, with the first lead connected to the output of the corresponding digital-to-analog converter, and the second lead connected to the corresponding input of the corresponding active-reactive circuit, being a lead of the adder and said reactive element connected to the seventh lead of said switching device, and the third leads of each two adders connected to the corresponding active-reactive circuit are connected to the eighth leads of the switching device.

13. A device according to claim 12 wherein said voltage converter for converting three-phase supply-line voltage to alternating single-phase voltage is grounded, and which device further includes:
   three scale converters each having two inputs and an output, with the first input of each said converter connected to one of the phases of said supply-line, and the second input grounded;
   three subtracting devices each having two inputs and two outputs, the first input of each of two subtracting devices connected to the output of one of two said scale converters, the second inputs of each two subtracting devices connected to the output of the said third scale converter, the outputs of said subtracting devices connected to the inputs of said voltage converter, the inputs of the third said subtracting device connected to the outputs of said function generators, with the second outputs of all the three said subtracting devices being earthed.

14. A method of detecting symmetrical components of a three-phase voltage according to claim 1, wherein said control signal generating step is effected by shifting the phase of a vector of the voltage drop across one of the elements of an active-reactive circuit, and subsequently altering it in amplitude in accordance with the relation between voltage drops across active and reactive elements of this circuit, and subtracting it from a vector of the voltage drop across the other element of the same circuit.

15. A device comprising:
   a voltage converter for converting three-phase supply-line voltage to alternating single-phase voltage, having inputs electrically connected to the phases of said supply-line, said voltage converter including:
   at least two function generators having inputs, said inputs serving as inputs of said voltage converter, with at least one of said function generators being an active-reactive circuit incorporating active and reactive elements, one lead of each said element serving as input of the corresponding active-reactive circuit and the corresponding function generator, whereas the other leads of said elements being connected to each other with their common point of connection serving as an output of the corresponding active-reactive circuit and of the corresponding function generator and being electrically connected to the information output of said device, with the output of the other function generator being also electrically connected to the information output of said device;
   a control signal shaper adapter to form control signals proportional to disturbance influence, and including:
   at least one subtracting device having two inputs and one output, the first input connected to one of said reactive element of said active-reactive circuit;
   at least one phase shifter having an input connected to said other active element in the corresponding active-reactive circuit, and an output connected to the second input of the corresponding said subtracting device;
   a disturbance compensator comprising at least one adder having two leads, the first of which leads being connected to the output of the corresponding subtracting device, and the second lead connected to one of the inputs of the corresponding said active-reactive circuit.

16. A device according to claim 15 wherein said voltage converter for converting three-phase supply-line voltage to alternating single-phase voltage is grounded, and which device further includes:
   three scale converters each having two inputs and an output, the first input of each said scale converter being connected to one of the phases of said supply-line, and the second input of each said scale converter being earthed;
   three subtracting devices each having two inputs and two outputs, each of two said subtracting devices having its first input connected to the output of one of two scale converters, and its second input connected to the output of the third said scale converter, the outputs of said subtracting devices being connected with the inputs of said voltage converter, with the third subtracting device having its inputs connected to the outputs of said function generators, and the second outputs of all the three subtracting devices being grounded.

* * * * *